United States Patent
Verma et al.

(10) Patent No.: US 11,682,799 B2
(45) Date of Patent: Jun. 20, 2023

(54) MODULAR BATTERY MONITOR

(71) Applicant: Air Transport Safety Inc., Phoenix, AZ (US)

(72) Inventors: Inder J. Verma, Phoenix, AZ (US); Willard A. Blevins, Dewey, AZ (US)

(73) Assignee: Air Transport Safety Inc., Phoenix, AZ (US)

( * ) Notice: Subject to any disclaimer, the term of this patent is extended or adjusted under 35 U.S.C. 154(b) by 189 days.

(21) Appl. No.: 17/064,681

(22) Filed: Oct. 7, 2020

(65) Prior Publication Data

US 2022/0109196 A1 Apr. 7, 2022

(51) Int. Cl.
*H01M 10/48* (2006.01)
*G01R 31/3835* (2019.01)
*H01M 50/569* (2021.01)

(52) U.S. Cl.
CPC ...... *H01M 10/482* (2013.01); *G01R 31/3835* (2019.01); *H01M 50/569* (2021.01)

(58) Field of Classification Search
CPC .......... G01R 19/16542; G01R 31/3835; G01R 31/392; G01R 31/396; H01M 10/482; H01M 50/569; H02J 7/0019; Y02E 60/10
See application file for complete search history.

(56) References Cited

U.S. PATENT DOCUMENTS

| | | | |
|---|---|---|---|
| 8,587,318 B2 | 11/2013 | Chandler et al. | |
| 8,598,840 B2 | 12/2013 | Yount et al. | |
| 9,197,081 B2 | 11/2015 | Fineberg et al. | |
| 10,193,194 B2 | 1/2019 | Nakatsuka et al. | |
| 2001/0011881 A1 | 8/2001 | Emori | |
| 2015/0077124 A1 | 3/2015 | Suzuki | |

FOREIGN PATENT DOCUMENTS

JP  2004104989  4/2004

OTHER PUBLICATIONS

Hof, Klaus-Dieter, "Extended European Search Report" dated Feb. 8, 2022, for European Patent Application No. 21201327.0, European Patent Office, Munich, Germany, 10 pages.

*Primary Examiner* — Victoria H Lynch
(74) *Attorney, Agent, or Firm* — Woods Oviatt Gilman LLP; Dennis B. Danella, Esq.

(57) ABSTRACT

A battery monitoring system for a battery pack having battery cells including a test cell and a reference voltage. The battery monitoring system includes built-in-test circuitry associated with the test cell. The built-in-test circuitry has a monitoring control operable to permit electric current between the reference voltage and the test cell and an enabling control operable to permit electric current between the reference voltage and the test cell. The battery monitoring system also includes battery monitoring circuitry having cell monitoring voltage interfaces configured to receive cell voltages associated with the battery cells and a built-in-test interface operable upon actuation by the battery monitoring circuitry to operate the monitoring control. A method for operating circuitry associated with the battery monitoring system is also provided.

28 Claims, 4 Drawing Sheets

“MODULAR BATTERY MONITOR

TECHNICAL FIELD

The present disclosure relates to batteries, and more specifically, to battery monitoring circuitry.

BACKGROUND OF THE INVENTION

Batteries, such as for example, Li-Ion batteries, are often used for high energy density applications. However, when the operating conditions of such batteries are improperly monitored, unsafe conditions may arise. For example, battery monitor circuits may be used for checking cell overvoltage or battery overload conditions. However, failing to properly monitor these conditions and others may lead to battery failure or, in some cases, fire or explosion.

It is the principal object of the present invention to address these needs and to provide a battery monitoring system configured to be used in multiple applications and having the flexibility to match the reliability and safety requirements of high energy density batteries such as Li-Ion batteries.

SUMMARY OF THE INVENTION

Disclosed is a battery monitoring system for a battery pack having battery cells including a test cell and a reference voltage. The battery monitoring system includes built-in-test circuitry associated with the test cell. The built-in-test circuitry has a monitoring control operable to permit electric current between the reference voltage and the test cell and an enabling control operable to permit electric current between the reference voltage and the test cell. The battery monitoring system also includes battery monitoring circuitry having cell monitoring voltage interfaces configured to receive cell voltages associated with the battery cells and a built-in-test interface operable upon actuation by the battery monitoring circuitry to operate the monitoring control.

Disclosed also is a modular battery monitor design enabling the design to be used in multiple battery configurations. By simply adding more modules in series, the battery modular design may be configured to handle systems with many cells.

Also disclosed is a method for operating built-in-test circuitry associated with battery monitoring circuitry and monitor enabling circuitry for a battery pack having battery cells including a test cell, an affiliated cell, and a reference voltage. The method includes performing a test routine initialization. The method includes measuring a preroutine affiliated cell voltage associated with the affiliated cell and a preroutine test cell voltage associated with the test cell. The method includes closing a monitoring control to permit electric current associated with the reference voltage and the test cell. The method includes closing an enabling control to permit electric current associated the reference voltage and the test cell. The method includes measuring a postroutine affiliated cell voltage associated with the affiliated cell and a postroutine test cell voltage associated with the test cell. The method includes balancing the test cell based on the preroutine affiliated cell voltage, the preroutine test cell voltage, the reference voltage, the postroutine affiliated cell voltage, and the postroutine test cell voltage.

Also disclosed is a computer readable medium for use by a controller in conducting a test routine associated with a battery pack having battery cells including a test cell and a reference voltage, the controller being associated with built-in-test circuitry having a monitoring control and an enabling control. The computer readable medium includes digital storage. The computer readable medium includes balance instructions stored on the digital storage operable upon execution by the controller to close a monitoring control to permit electric current associated with the reference voltage and the test cell. The computer readable medium includes preroutine instructions operable upon execution by the controller to measure a preroutine affiliated cell voltage associated with the affiliated cell and a preroutine test cell voltage associated with the test cell. The computer readable medium includes postroutine instructions operable upon execution by the controller to measure a postroutine affiliated cell voltage associated with the affiliated cell and a postroutine test cell voltage associated with the test cell. The computer readable medium includes balancing the test cell based on the preroutine affiliated cell voltage, the preroutine test cell voltage, the reference voltage, the postroutine affiliated cell voltage, and the postroutine test cell voltage.

DETAILED DESCRIPTION

Figure 1:
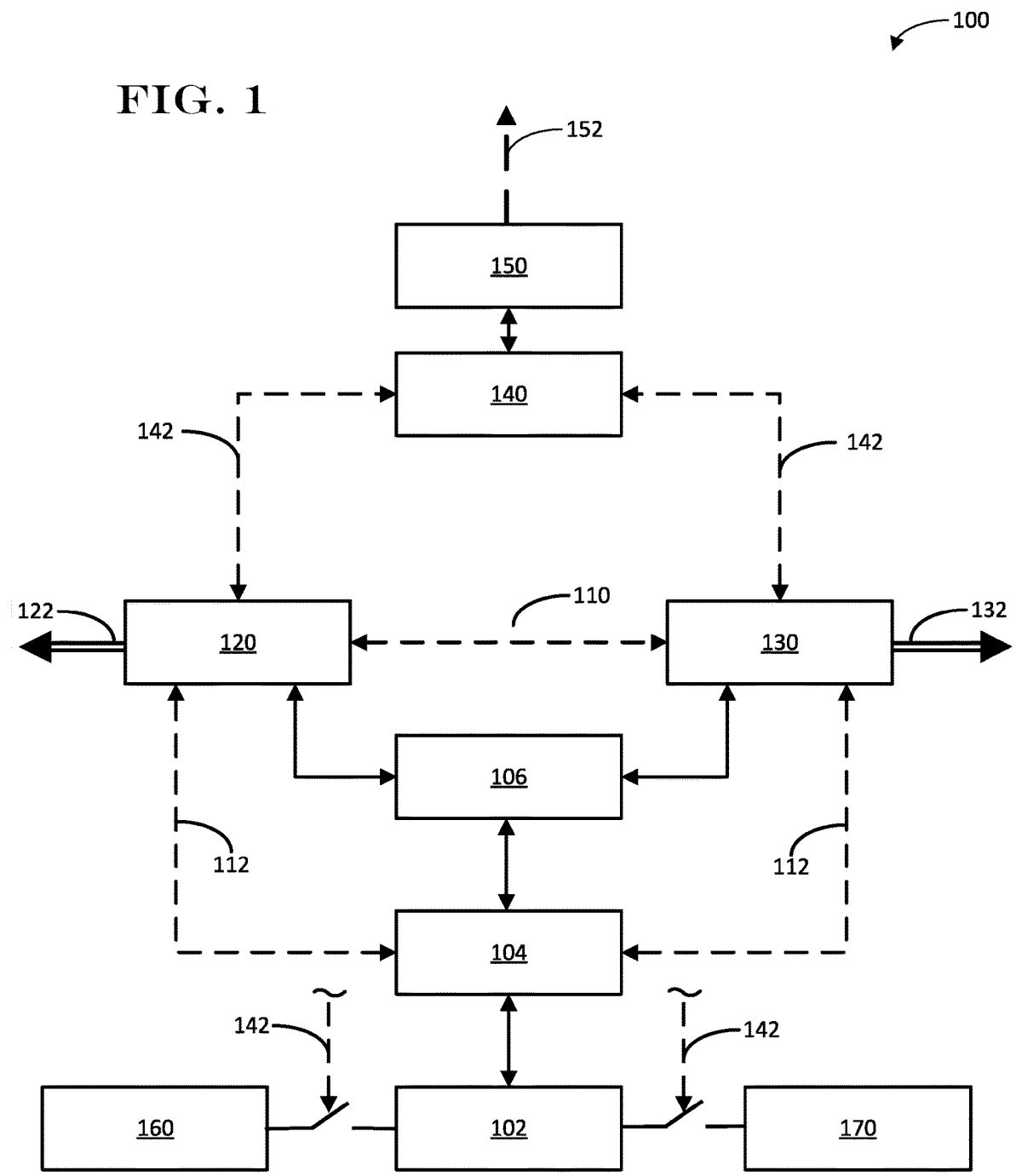
FIG. 1 depicts a schematic diagram of a battery monitoring system.

Various systems or methods will be described below to provide an example of an embodiment of the claimed subject matter. No embodiment described below limits any claimed subject matter, and any claimed subject matter may cover methods or systems that differ from those described below. The claimed subject matter is not limited to systems or methods having all of the features of any one system or method described below or to features common to multiple or all of the apparatuses or methods described below. It is possible that a system or method described below is not an embodiment that is recited in any claimed subject matter. Any subject matter disclosed in a system or method described below that is not claimed in this document may be the subject matter of another protective instrument, for example, a continuing patent application, and the applicants, inventors, or owners do not intend to abandon, disclaim or dedicate to the public any such subject matter by its disclosure in this document.

Furthermore, it will be appreciated that for simplicity and clarity of illustration, where considered appropriate, reference numerals may be repeated among the figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, well-known methods, procedures, and components have not been described in detail so as not to obscure the embodiments described herein. Also, the description is not to be considered as limiting the scope of the embodiments described herein.

It should also be noted that the terms “coupled” or “coupling” as used herein can have several different meanings depending on the context in which these terms are used.

For example, the terms coupled or coupling may be used to indicate that an element or device can electrically, optically, or wirelessly send data to another element or device as well as receive data from another element or device.

It should be noted that terms of degree such as "substantially," "about," and "approximately" as used herein mean a reasonable amount of deviation of the modified term such that the end result is not significantly changed. These terms of degree may also be construed as including a deviation of the modified term if this deviation would not negate the meaning of the term it modifies.

The example embodiments of the systems and methods described herein may be implemented as a combination of hardware or software. In some cases, the example embodiments described herein may be implemented, at least in part, by using one or more computer programs, executing on one or more programmable devices comprising circuitry having at least one processing element and a data storage element (including volatile memory, non-volatile memory, storage elements, or any combination thereof). These devices may also have at least one input device (e.g., a keyboard, mouse, a touchscreen, and the like), and at least one output device (e.g., a display screen, a printer, a wireless radio, and the like) depending on the nature of the device.

It should also be noted that there may be some elements that are used to implement at least part of one of the embodiments described herein that may be implemented via software that is written in a high-level computer programming language such as object-oriented programming. Accordingly, the program code may be written in C, C #, JAVA, or any other suitable programming language and may comprise modules or classes, as is known to those skilled in computer programming. Alternatively, or in addition, thereto, some of these elements implemented via software may be written in assembly language, machine language, or firmware as needed. In either case, the language may be a compiled or interpreted language.

At least some of these software programs may be stored on a storage media (e.g., a computer readable medium such as, but not limited to, ROM, magnetic disk, optical disc) or a device that is readable by a general or special purpose programmable device (i.e., digital storage). The software program code, when read by the programmable device, configures the programmable device to operate in a new, specific, and predefined manner to perform at least one of the methods described herein.

Furthermore, at least some of the programs associated with the systems and methods of the embodiments described herein may be capable of being distributed in a computer program product comprising a computer readable medium that bears computer usable instructions for one or more processors. The medium may be provided in various forms, including non-transitory forms such as, but not limited to, one or more diskettes, compact disks, tapes, chips, and magnetic and electronic storage.

Battery packs may be comprised of battery cells arranged in series or parallel to provide electricity to a load. The manufacture of battery cells does not always guarantee uniform cell behavior, as the various battery cells may have different charge rates, voltage outputs, and internal resistances. As such, operation of the battery pack may result in output imbalances among the several battery cells. These imbalances may result in undesirable wear and tear on the battery cells, individually, requiring maintenance or replacement.

A battery monitoring system may be implemented to monitor the state of charge associated with each battery cell. The battery monitoring system may be capable of balancing disparate battery cell voltages using a current bypass, a capacitive shuttle, or any other implement.

A battery monitoring system may be implemented with circuitry. Due to degradation or other error modes, the battery monitoring system may incorrectly analyze the state of charge or improperly balance the individual battery cells. As one of many examples, a control, switch, or transistor may be unsuccessful in actuating, causing an unintended circuit configuration.

A battery monitoring system may be modular. Any number of monitoring circuitry may be coordinated, as discussed herein, to monitor any number of battery cells and associated monitoring circuits. As the number of battery cells increases, the number of modules may similarly increase, improving robustness, or be maintained, improving packaging conformance. Indeed, the number of monitoring circuits may be optimized to provide performance, measurement features, robustness, conformance to build constraints, serviceability, aesthetics, or any other factor. It should be appreciated that the modular monitoring circuitry may reduce erroneous data by collectively verifying battery voltage measurements to detect stuck or inoperable controls. As such, the erroneous module may be isolated or disabled to reduce or eliminate undesigned operation. A balancing load may be removed from the associated cells based on the undesigned operation of the associated monitoring circuitry.

Figure 2:
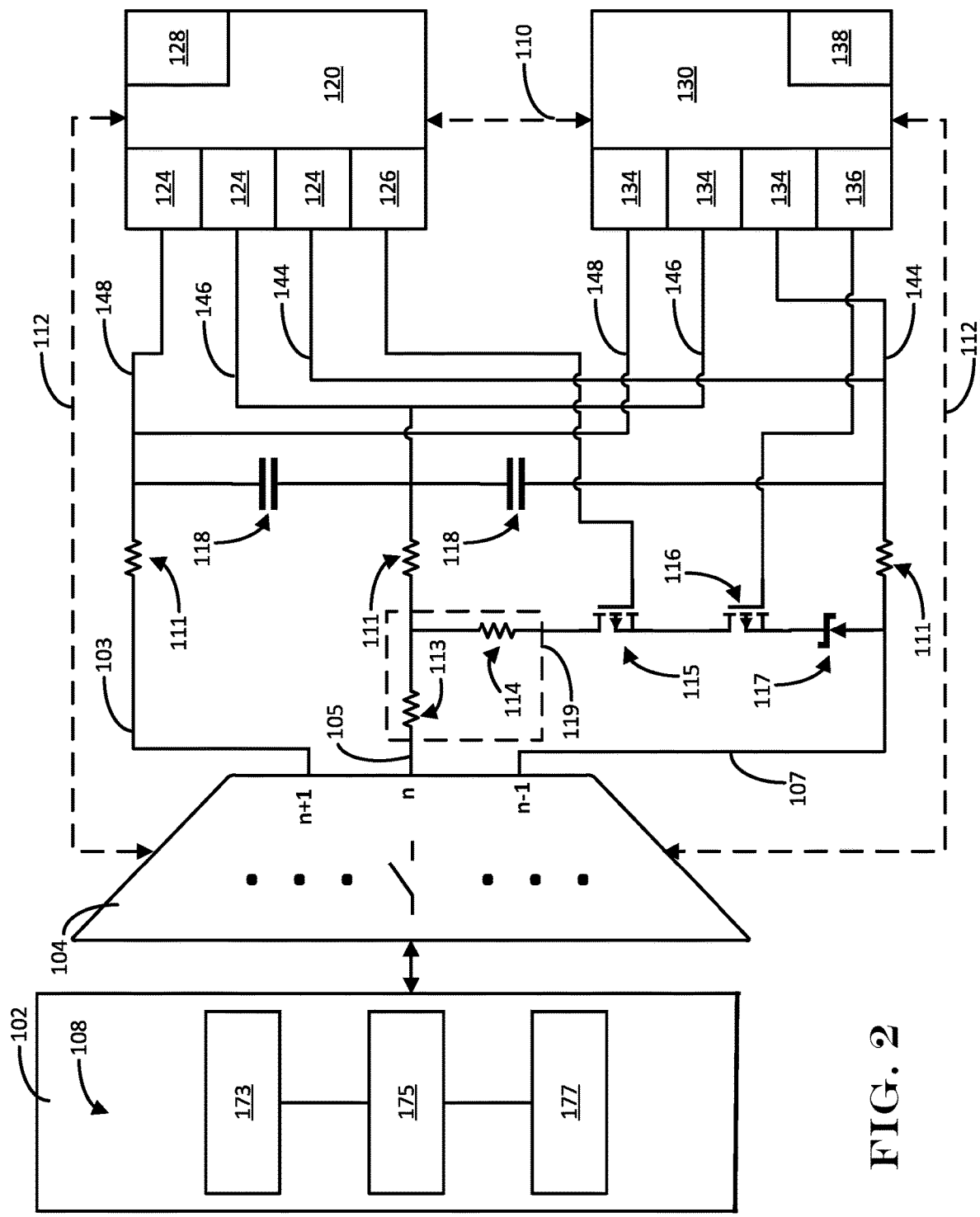
FIG. 2 depicts a schematic diagram of a battery monitoring system having a battery pack and battery monitoring circuitry.

Referring to FIG. 1, a battery monitoring system 100 in accordance with one or more example implementations is shown. The battery monitoring system 100 may include or be associated with a battery pack 102. The battery pack may be associated with charging circuitry 160 and load circuitry 170. The battery pack 102 may include one or more battery cells 108 (as shown in FIG. 2). The battery monitoring system 100 may include balancing circuitry. The balancing circuitry may include capacitive charge shuttle circuitry, current bypass circuitry, another implement, or any combinations thereof. The balancing circuitry may balance the voltages of the battery cells 108.

The battery pack 102 may be associated with a multiplexor 104. The battery pack 102 may be associated with built-in-test circuitry 106 through the multiplexor 104. The built-in-test circuitry 106 may be or may include any combination of elementary electrical components. The built-in-test circuitry 106 may be or may include a microcontroller, microprocessor, onboard memory, access to offboard memory, and a variety of interconnects for communicating with other components of the battery monitoring system 100.

The multiplexor 104 may select or associate particular battery cells 108 from the battery pack 102 with the balancing circuitry and the built-in-test circuitry 106. The selected battery cells 108 may be defined as a selection of battery cells 108. The built-in-test circuitry 106 may be cooperatively connected with the balancing circuitry and connected with the battery pack 102 or independently connected to the battery pack 102 through the multiplexor 104. As one of many example implementations, the built-in-test circuitry 106 and the balancing circuitry may be collectively associated with the battery pack 102 through the multiplexor 104. As another, the built-in-test circuitry 106 and the balancing circuitry may be individually selected by the multiplexor 104. It should be appreciated that associations and connections between circuitry may be electrical connections, data connections, another type of interconnection, or any combination thereof.

The built-in-test circuitry 106 may be associated with battery monitoring circuitry 120. The battery monitoring circuitry 120 may be or may include any combination of elementary electrical components. The battery monitoring circuitry 120 may be or may include a microcontroller, microprocessor, onboard memory, access to offboard memory, and a variety of interconnects for operating and monitoring the built-in-test circuitry 106 and interfacing with other components of the battery monitoring system 100. The built-in-test circuitry 106 may be associated with monitor enabling circuitry 130. The monitor enabling circuitry 130 may be or may include any combination of elementary electrical components. The monitor enabling circuitry 130 may be or may include a microcontroller, microprocessor, onboard memory, access to offboard memory, and a variety of interconnects for operating and monitoring the built-in-test circuitry 106 and interfacing with other components of the battery monitoring system 100. One or more of the battery monitoring circuitry 120 and the monitor enabling circuitry 130 may include additional inputs for receiving temperature sensor data or voltage data through sensor buses 122, 132.

The built-in-test circuitry 106 may be disposed on the same printed circuit board as the battery monitoring circuitry 120 and the monitor enabling circuitry 130. The built-in-test circuitry 106 may be disposed on circuit boards different from the circuit board for the battery monitoring circuitry 120 and the circuit board for the monitor enabling circuitry 130. The battery monitoring circuitry 120 and the monitor enabling circuitry 130 may be in communication with the built-in-test circuitry 106 through control circuitry 112. The control circuitry 112 may be digital or analog. The control circuitry 112 may directly operate the built-in-test circuitry 106 with electrical signals or communicate with the built-in-test circuitry 106 through digital signals. The battery monitoring circuitry 120 and the monitor enabling circuitry 130 may communicate through communication circuitry 110. The communication circuitry 110 may be digital or analog. The communication circuitry may allow the battery monitoring circuitry 120 and the monitor enabling circuitry 130 to orchestrate operations associated with the built-in-test circuitry 106 or other components of the battery monitoring system 100. The battery monitoring circuitry 120 and the monitor enabling circuitry 130 may interface with network access circuitry 140 through serial interfaces 142. It should be appreciated that any form of communication or communications protocol may be used. As an example, the network access circuitry 140 may convert $I^2C$ communications to controller area network (CAN) communications for interfacing with the CAN driver 150 and disseminating information on a CAN bus 152. The serial interfaces may 142 may be further associated with switches for connecting and disconnecting the charging circuitry 160 and load circuitry 170 from the battery pack 102.

FIG. 2 depicts the battery pack 102 and the battery monitoring circuitry 120 in accordance with one or more implementations of the present disclosure. As shown, the battery pack 102 includes one or more battery cells 108. The battery cells 108 may have terminal connections selectable by the multiplexor 104. The multiplexor 104 may include switching circuitry for selecting a reference voltage 144. The reference voltage 144 may be based on a reference cell of the battery cells 108. The reference voltage 144 may be based on a ground voltage associated with the battery pack 102. The reference voltage 144 may be based on a reference cell that precedes the test cell when the battery pack 102 has a series (voltage stack) configuration. The test voltage 146 may be associated with a test cell of the battery pack 102. An affiliated voltage 148 may be associated with an affiliated cell of the battery pack 102. In one of many applicable implementations, the reference voltage 144 may be from a battery cell 108 that precedes a battery cell 108 having the test voltage 146, and the affiliated voltage 148 may be from a battery cell 108 that supersedes the battery cell 108 having the test voltage 146.

The built-in-test circuitry 106 or other balancing circuitry may include capacitors 118 in parallel with the battery cells 108. The capacitors may be configured as current shuttle capacitors 118. The built-in-test circuitry 106 or other balancing circuitry may include current bypass resistors 111. Switches may be disposed to isolate particular cells or bypass particular cells to balance the battery cells 108 in the battery pack.

The built-in-test circuitry 106 includes voltage sensing circuitry 119. The voltage sensing circuitry 119 may be any implement. As one example, the voltage sensing circuitry 119 may include a voltage divider circuit having a common resistance 113 and a series resistance 114. The voltage sensing circuitry 119 defines an output voltage corresponding to the test voltage 146 and the reference voltage 144. The voltage sensing circuitry 119 may be any combination of elementary electrical components. The battery monitoring circuitry 120 includes cell monitoring voltage interfaces 124 for receiving the respective reference voltage 144, test voltage 146, and the affiliated voltage 148.

The built-in-test circuitry 106 may include a monitoring control 115 and an enabling control 116. The monitoring control 115 and the enabling control 116 may be of any implement. The monitoring control 115 and the enabling control 116 may be of any implement may be the same or different implements. As one of many examples, the monitoring control 115 and the enabling control 116 may be transistor operable by the respective battery monitoring circuitry 120 or monitor enabling circuitry 130, as shown in FIG. 2. Other example implements may include electromechanical devices, other solid-state devices, or any combination thereof. As an example, the monitoring control 115 and the enabling control 116 may be electromechanical relays or solenoid implements. The built-in-test circuitry 106 may include a Zener diode 117 or another voltage control device to regulate the voltage between the test cell voltage 105 and the reference voltage 107. The monitoring control 115 may be operable by the battery monitoring circuitry 120 through the built-in-test interface 126. The enabling control 116 may be operable by the monitor enabling circuitry 130 through the enable interface 136. The built-in-test interface 126 and the enable interface 136 may be digital or voltage outputs from the battery monitoring circuitry 120 and monitor enabling circuitry 130, respectively. The built-in-test interface 126 and the enable interface 136 may be any other implement whether operated by elementary electrical components or digital controllers.

Figure 4:
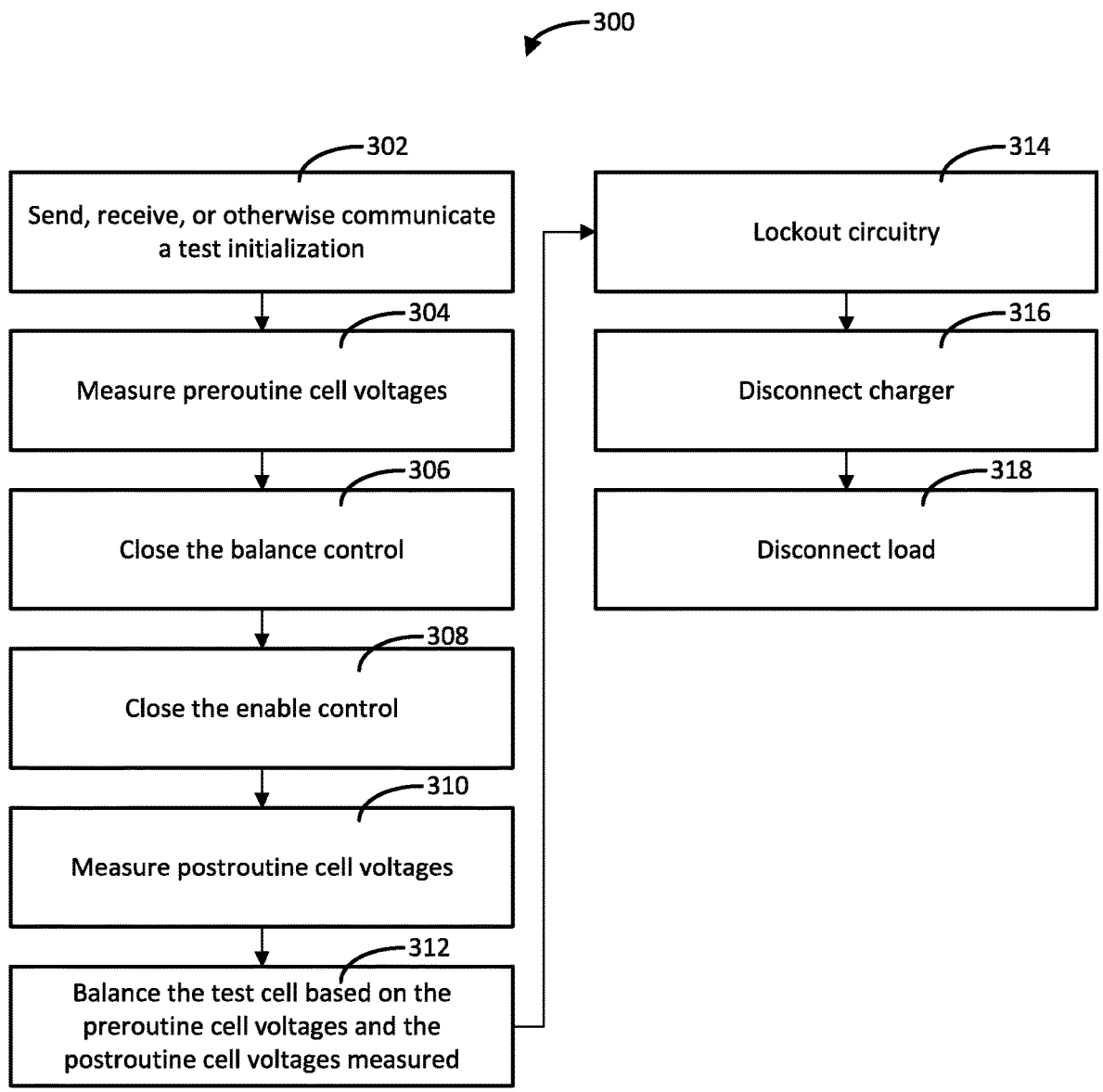
FIG. 4 depicts a flow diagram for operating built-in-test circuitry.

The battery monitoring circuitry 120 and monitor enabling circuitry 130 may include a microcontroller, microprocessor, onboard memory, access to offboard memory, or other digital control systems for performing the test routine 300 (as shown in FIG. 4). As an example, the battery monitoring circuitry 120 and monitor enabling circuitry 130 may include respective or collective digital storage devices 128, 138. The digital storage devices 128, 138 may be any implement. The digital storage devices 128, 138 may include instructions disposed thereon operable upon execution by the battery monitoring circuitry 120 and monitor enabling circuitry 130 to perform at least the steps disclosed in the test routine 300.

The test voltage 146 may be have two or more distinct values during a test routine. As an example, the test voltage 146 received at the cell monitoring voltage interface 124 preroutine may be proportional to the test cell voltage 105. The test voltage 146 received at the cell monitoring voltage interface 124 postroutine may be based on the test cell voltage 105 shown in Equation 1.

$$V_{146} = \frac{R_{114} * (V_{105} - Z_{117})}{R_{113} + R_{114}} + Z_{117} \quad (1)$$

where $V_{146}$ is the voltage received at the cell monitoring voltage interface 124 corresponding to the test cell 175, $R_{113}$ is the resistance of the common resistance 113, $R_{114}$ is the resistance of the series resistance 114, $V_{103}$ is the affiliate cell voltage 103 associated with the affiliate cell 173 of the battery cells 108 before the monitoring control 115 and the enabling control 116 are closed during the test routine 300 (as shown in FIG. 4), and $Z_{117}$ is the breakdown voltage of the Zener diode 117. The affiliate voltage 148 may have two or more distinct values during a test routine. As an example, the voltage received at the cell monitoring voltage interface 124 preroutine may be proportional to the affiliate cell voltage 103. The affiliate voltage 146 received at the cell monitoring voltage interface 124 postroutine may be based on the test cell voltage 105 and the affiliate cell voltage 103 shown in Equation 2.

$$V_{148} = \frac{R_{113} * (V_{105} - Z_{117})}{R_{113} + R_{114}} + V_{103} \quad (2)$$

Similar voltages may be received by the cell enablement voltage interfaces 134. That is, all of the voltages received by the cell monitoring voltage interface 124 may be received by the cell enablement voltage interfaces 134 of the monitor enabling circuitry 130 for redundant monitoring and comparison to ensure proper operation of the battery monitoring circuitry 120.

The battery monitoring circuitry 120 and monitor enabling circuitry 130 may use the received voltages to determine balance operations for the battery cells 108. It should be appreciated that the battery monitoring circuitry 120 and monitor enabling circuitry 130 may orchestrate the test routine 300 through communication circuitry. As an example, the battery monitoring circuitry 120 and monitor enabling circuitry 130 may synchronize test routines 300 to ensure the monitoring control 115 and the enabling control 116 are actuated in concert. Indications, flags, or tags may be exchanged. The battery monitoring circuitry 120 and monitor enabling circuitry 130 may exchange received data to determine anomalies.

Figure 3:
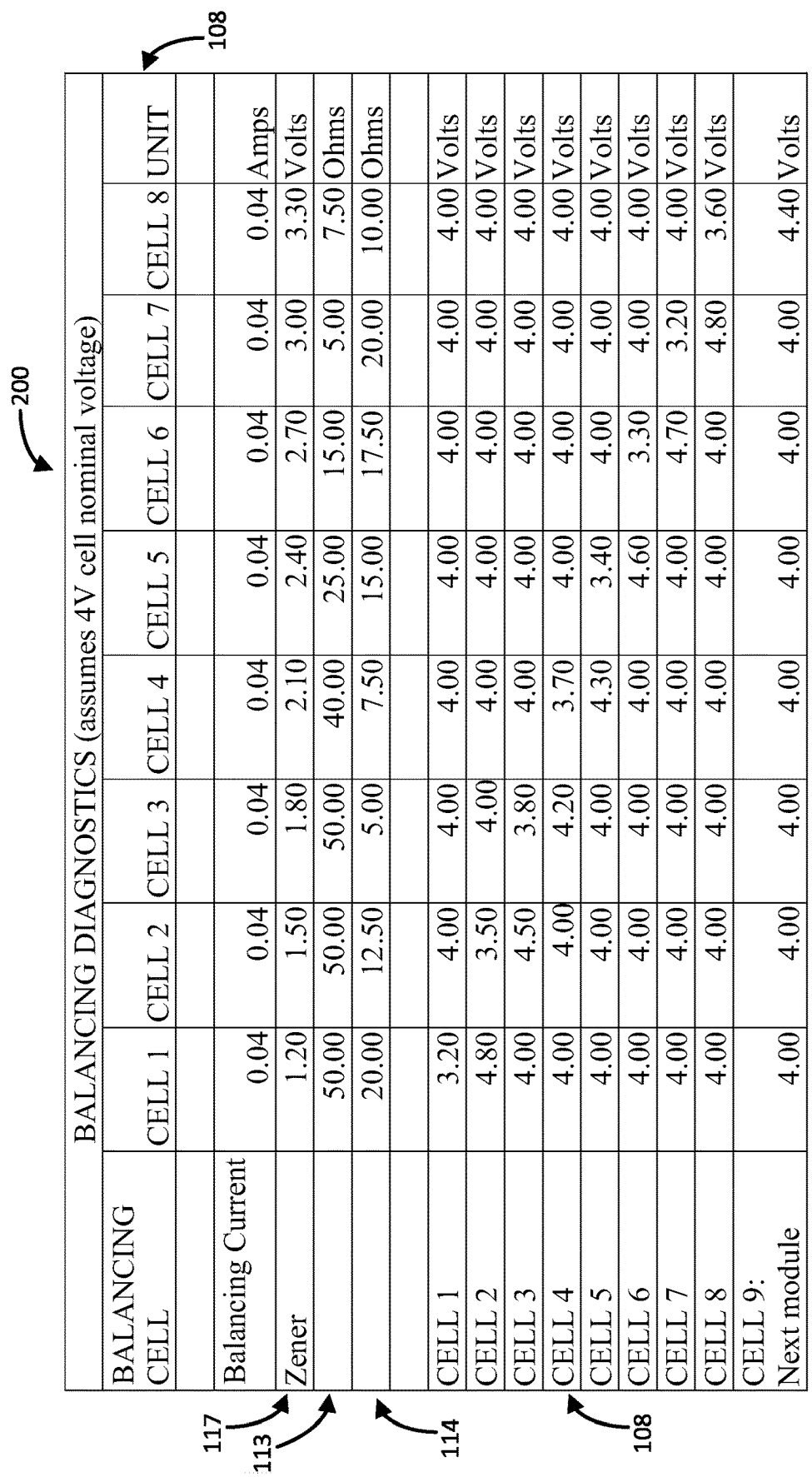
FIG. 3 depicts a table with example diagnostic values.

Referring to FIG. 3, a table 200 of expected values or computed values stored in memory of the battery monitoring circuitry 120 and monitor enabling circuitry 130 is shown in accordance with one or more implementations of the present disclosure. The table 200 depicts an eight-cell battery pack 102. Each of the battery cells 108 is associated with a particular Zener diode 117 and the depicted Zener breakdown voltages. It should be appreciated that the multiplexor 104 may engage the particular Zener diode based on the test routine 300 orchestrated by the battery monitoring circuitry 120 and monitor enabling circuitry 130. The multiplexor 104 may also engage particular combinations of common resistance and series resistance based on the test routine 300 orchestrated by the battery monitoring circuitry 120 and monitor enabling circuitry 130. That is, the multiplexor 104 may engage voltage sensing circuitry 119 particular to the test cell 175 or the affiliated cell 173, test cell 175, reference voltage 177 collective. As such, Equations 1 and 2 may be used to populate the table with calculated voltages associated with the affiliate cell voltage 148, test cell voltage 146, or the reference voltage 144, or for comparison with table values to determine balancing requirements and measurement error.

Now turning to FIG. 4, portions of a test routine 300 are shown in one or more implementations of the present disclosure. It should be appreciated that the steps disclosed may be expanded, repeated, rearranged, and omitted, and any alterations thereof are contemplated by this disclosure. In step 302, a test initiation is communicated by one or both of the battery monitoring circuitry 120 and monitor enabling circuitry 130. The communication may be performed over the communication circuitry 110, internal circuitry, or any combination thereof. The communication may include clock synchronization and a specific time to perform the monitoring.

In step 304, the preroutine cell voltages are measured by the battery monitoring circuitry 120 and monitor enabling circuitry 130. The cell monitoring voltage interfaces 124 and cell enablement voltage interfaces 134 may receive the cell voltages 103, 105, 107. In step 306, the monitoring control 115 is closed by the battery monitoring circuitry 120. In step 308, the enabling control 116 is closed by the monitor enabling circuitry 130. In step 310, the cell monitoring voltage interfaces 124 and cell enablement voltage interfaces 134 may receive the cell voltages 103, 105, 107, and the postroutine cell voltages are measured.

In step 312 the test cell 175 may be balanced based on the preroutine cell voltages and the postroutine cell voltages measured. If the voltages received do not correspond to the values of table 200 or the values from tables 200 stored in each of the battery monitoring circuitry 120 and monitor enabling circuitry 130, compared via communication circuitry 110, the monitor enabling circuitry 130 may disable actuation of the enabling control 116 for the current and subsequent test routines to ensure erroneous data is not distributed by the battery monitoring system 100 in step 314.

Lock out performed in step 314 may simply be opening the enabling control 116 or locking out may include other various steps that may include offboard communication, isolating the battery pack 102, or any combination thereof. The enabling control 116 may be operated to deny electric current between the reference voltage 107 and the test cell voltage 105. As an example, the enabling control 116 may be opened. The operation of the enabling control 116 may be performed according to the orchestration of the test routine 300 by the monitor enabling circuitry 130. The operation of the enabling control 116 may be performed according to the comparison of received affiliate voltage 148 and the test voltage 146 and the table 200. The operation of the enabling control 116 may be based on the Zener breakdown voltage associated with the test routine 300. The Zener breakdown voltage may be unique to the particular test routine 300, as shown in table 200. If the measured preroutine and postroutine voltage values do not correspond with the table 200 the battery monitoring circuitry 120 and monitor enabling circuitry 130 may individually or collectively disconnect the charging circuitry 160 and load circuitry 170 from the battery pack in step 316 and step 318.

It should be appreciated that any of the operations performed by the battery monitoring circuitry 120 or monitor enabling circuitry 130 may be performed by either the battery monitoring circuitry 120 or monitor enabling circuitry 130. That is, the performance of specific actions related to the battery monitoring circuitry 120 and monitor enabling circuitry 130 is for clarity only, and in the application any number of the battery monitoring circuitry 120 and monitor enabling circuitry 130 may be employed to test the battery cells 108 and control the associated monitoring control 115 and enabling control 116.

What is claimed:

1. A battery monitoring system for a battery pack having battery cells including a test cell and a reference voltage, the battery monitoring system comprising:
   built-in-test circuitry associated with the test cell, the built-in-test circuitry having a monitoring control operable to permit electric current between the reference voltage and the test cell and an enabling control operable to permit electric current between the reference voltage and the test cell;
   battery monitoring circuitry having cell monitoring voltage interfaces configured to receive cell voltages associated with the battery cells and a built-in-test interface operable upon actuation by the battery monitoring circuitry to operate the monitoring control; and
   monitor enabling circuitry having an enable interface operable upon actuation by the monitor enabling circuitry to operate the enabling control, wherein the monitor enabling circuitry further comprises cell enablement voltage interfaces configured to receive cell voltages associated with the battery cells, and wherein the monitor enabling circuitry is in communication with the battery monitoring circuitry to provide operation orchestration of the monitoring control and the enabling control.

2. The battery monitoring system of claim 1, wherein the monitor enabling circuitry further comprises a digital storage device, and instructions stored on the digital storage device readable by the monitor enabling circuitry, the instructions operable upon execution by the monitor enabling circuitry to operate the enabling control to deny electric current between the reference voltage and test cell.

3. The battery monitoring system of claim 2, wherein the instructions are operable upon actuation by the monitor enabling circuitry to receive indication of operation of the monitoring control by the communication and deny electric current between the reference voltage and the test cell with the enabling control based on the operation orchestration.

4. The battery monitoring system of claim 2, wherein the instructions are further operable upon execution by the monitor enabling circuitry to operate the enabling control based on calculated voltages of the test cell and an affiliated cell associated with the test cell according to the reference voltage.

5. The battery monitoring system of claim 4, wherein the built-in-test circuitry further comprises a Zener diode associated with the test cell and the reference voltage, and the calculated voltage of the affiliated cell is based on a Zener breakdown voltage of the Zener diode.

6. The battery monitoring system of claim 5 further comprising, a multiplexor associated with the built-in-test circuitry and the battery monitoring circuitry configured to select the battery cells associated, as a selection, with the built-in-test circuitry and the battery monitoring circuitry, wherein the Zener diode corresponds to the selection and the Zener breakdown voltage is based on the selection.

7. The battery monitoring system of claim 6, wherein the Zener breakdown voltage is unique to the selection.

8. The battery monitoring system of claim 1, wherein the built-in-test circuitry further comprises voltage sensing circuitry configured to sense test voltage between the test cell and the reference voltage, and the test voltage is based on one of the cell voltages.

9. The battery monitoring system of claim 1, wherein the reference voltage is based on a reference cell of the battery cells.

10. The battery monitoring system of claim 1, further comprising a multiplexor associated with the built-in-test circuitry and wherein the battery monitoring circuitry is configured to select the battery cells associated with the built-in-test circuitry and the battery monitoring circuitry.

11. The battery monitoring system of claim 1, further comprising:
    charging circuitry to charge the battery pack; and
    load circuitry to power a load using the battery pack;
    wherein voltages received at the cell monitoring voltage interfaces and the cell enablement voltage interfaces are compared, and wherein at least one of the monitor enabling circuitry and the battery monitoring circuitry is configured to disconnect at least one of the charging circuitry and the load circuitry from the battery pack.

12. The battery monitoring system of claim 1, wherein the monitor enabling circuitry is redundant of the battery monitoring circuitry, wherein the monitor enabling circuitry is configured to compare voltages received at the cell monitoring voltage interfaces and the cell enablement voltage interfaces to ensure proper operation of the battery monitoring circuitry.

13. A computer readable medium for use by a controller in conducting a test routine associated with a battery pack having battery cells including a test cell and a reference voltage, the controller being associated with built-in-test circuitry having a monitoring control and an enabling control, comprising:
    digital storage;
    monitor instructions stored on the digital storage operable upon execution by the controller to close a monitoring control to permit electric current associated with the reference voltage and the test cell;
    preroutine instructions stored on the digital storage operable upon execution by the controller to measure a preroutine affiliated cell voltage associated with the affiliated cell and a preroutine test cell voltage associated with the test cell;
    postroutine instructions stored on the digital storage operable upon execution by the controller to measure a postroutine affiliated cell voltage associated with the affiliated cell and a postroutine test cell voltage associated with the test cell;
    lockout instructions stored on the digital storage operable upon execution by the controller to disable the enabling control based on the preroutine affiliated cell voltage, the preroutine test cell voltage, the reference voltage, the postroutine affiliated cell voltage, and the postroutine test cell voltage; and
    operation orchestration instructions stored on the digital storage operable upon execution by the controller to enable communication between monitor enabling circuitry and battery monitoring circuitry of the built-in-test circuitry to provide operation orchestration of the monitoring control and the enabling control.

14. The computer readable medium of claim 13, further comprising selection instructions stored on the digital storage operable upon execution by the controller to operate a multiplexor to select the test cell, the affiliated cell, and the reference voltage.

15. The computer readable medium of claim 13, further comprising:
charging instructions stored on the digital storage operable upon execution by the controller to enable charging of the battery pack;
load instructions stored on the digital storage operable upon execution by the controller to enable powering a load using the battery pack;
comparison instructions for comparing voltages received at the cell enablement voltage interfaces and the cell enablement voltage interfaces; and
disconnecting instructions for disconnecting at least one of charging circuitry and load circuitry from the battery pack based on the comparison.

16. The computer readable medium of claim 13, wherein the built-in-test circuitry comprises battery monitoring circuitry having cell monitoring voltage interfaces and monitor enabling circuitry having cell enablement voltage interfaces, the computer readable medium further comprising comparison instructions to compare voltages received by the cell monitoring voltage interfaces and the cell enabling voltage interfaces to ensure proper operation of the battery monitoring circuitry.

17. A modular battery monitoring system for a plurality of battery packs, each battery pack having a plurality of battery cells including a test cell and a reference voltage, the modular battery monitoring system comprising:
one or more modules, each of the one or more modules comprising test circuitry associated with a battery pack, the test circuitry associated with the test cell, the test circuitry having a monitoring control operable to permit electric current between the reference voltage and the test cell and an enabling control operable to permit electric current between the reference voltage and the test cell;
battery monitoring circuitry having cell monitoring voltage interfaces configured to receive cell voltages associated with the plurality of battery cells and a built-in-test interface operable upon actuation by the battery monitoring circuitry to operate the monitoring control; and
monitor enabling circuitry having an enable interface operable upon actuation by the monitor enabling circuitry to operate the enabling control, wherein the monitor enabling circuitry further comprises cell enablement voltage interfaces configured to receive cell voltages associated with the plurality of battery cells, and wherein the monitor enabling circuitry is in communication with the battery monitoring circuitry to provide operation orchestration of the monitoring control and the enabling control;
wherein as a number of battery packs changes, a number of modules changes accordingly.

18. The modular battery monitoring system of claim 17, wherein as the number of battery packs increases, the number of modules increases.

19. The modular battery monitoring system of claim 17, wherein the number of battery packs matches the number of modules.

20. The modular battery monitoring system of claim 17, wherein the monitor enabling circuitry further comprises a digital storage device, and instructions stored on the digital storage device readable by the monitor enabling circuitry, the instructions operable upon execution by the monitor enabling circuitry to operate the enabling control to deny electric current between the reference voltage and test cell.

21. The modular battery monitoring system of claim 20, wherein the instructions are operable upon actuation by the monitor enabling circuitry to receive indication of operation of the monitoring control by the communication and deny electric current between the reference voltage and the test cell with the enabling control based on the operation orchestration.

22. The modular battery monitoring system of claim 20, wherein the instructions are further operable upon execution by the monitor enabling circuitry to operate the enabling control based on calculated voltages of the test cell and an affiliated cell associated with the test cell according to the reference voltage.

23. The modular battery monitoring system of claim 22, wherein the test circuitry further comprises a Zener diode associated with the test cell and the reference voltage, and the calculated voltage of the affiliated cell is based on a Zener breakdown voltage of the Zener diode.

24. The modular battery monitoring system of claim 23 further comprising, a multiplexor associated with the test circuitry and the battery monitoring circuitry configured to select the plurality of battery cells associated, as a selection, with the test circuitry and the battery monitoring circuitry, wherein the Zener diode corresponds to the selection and the Zener breakdown voltage is based on the selection.

25. The modular battery monitoring system of claim 24, wherein the Zener breakdown voltage is unique to the selection.

26. The modular battery monitoring system of claim 17, wherein the test circuitry further comprises voltage sensing circuitry configured to sense test voltage between the test cell and the reference voltage, and the test voltage is based on one of the cell voltages.

27. The modular battery monitoring system of claim 17, wherein the reference voltage is based on a reference cell of the plurality of battery cells.

28. The modular battery monitoring system of claim 17, further comprising a multiplexor associated with the test circuitry and wherein the battery monitoring circuitry is configured to select the plurality of battery cells associated with the test circuitry and the battery monitoring circuitry.

\* \* \* \* \*